United States Patent
Ingle et al.

(10) Patent No.: US 9,978,964 B2
(45) Date of Patent: May 22, 2018

(54) ORGANIC LIGHT-EMITTING COMPONENT HAVING ORGANIC LIGHT-EMITTING DIODE INTEGRALLY CONNECTED TO CIRCUIT BOARD

(71) Applicant: OSRAM OLED GmbH, Regensburg (DE)

(72) Inventors: Andrew Ingle, Allershausen (DE); Marc Philippens, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days. days.

(21) Appl. No.: 14/902,331

(22) PCT Filed: Jul. 11, 2014

(86) PCT No.: PCT/EP2014/064966
§ 371 (c)(1),
(2) Date: Dec. 30, 2015

(87) PCT Pub. No.: WO2015/007657
PCT Pub. Date: Jan. 22, 2015

(65) Prior Publication Data
US 2016/0329511 A1 Nov. 10, 2016

(30) Foreign Application Priority Data
Jul. 15, 2013 (DE) .......... 10 2013 107 467

(51) Int. Cl.
*H01L 51/00* (2006.01)
*H01L 51/52* (2006.01)
*H05K 1/16* (2006.01)

(52) U.S. Cl.
CPC ...... *H01L 51/0096* (2013.01); *H01L 51/0023* (2013.01); *H01L 51/5203* (2013.01);
(Continued)

(58) Field of Classification Search
CPC ............. H01L 51/0096; H01L 51/5203; H01L 51/524; H01L 51/0023
See application file for complete search history.

(56) References Cited

U.S. PATENT DOCUMENTS 7,551,454 B2 6/2009 Wuchse et al.
2002/0158585 A1* 10/2002 Sundahl ................. H02S 40/38
315/149

(Continued)

FOREIGN PATENT DOCUMENTS

| EP | 1087649 A2 | 3/2001 |
| EP | 1665911 A1 | 6/2006 |
| WO | 2012097008 A2 | 7/2012 |

*Primary Examiner* — Michael Jung
(74) *Attorney, Agent, or Firm* — Slater Matsil, LLP

(57) ABSTRACT

An organic light-emitting component includes an organic light-emitting diode which has at least one organic layer arranged to generate light and a printed circuit board with electrical conductor tracks. The printed circuit board is an integral component of the organic light-emitting diode. At least one of the electrical conductor tracks of the printed circuit board is connected in electrically conductive manner to the organic layer of the organic light-emitting diode. The printed circuit board is electrically contactable from the side remote from the organic light-emitting diode.

11 Claims, 4 Drawing Sheets

(52) U.S. Cl.
CPC ........ *H01L 51/524* (2013.01); *H01L 51/5243* (2013.01); *H05K 1/16* (2013.01); *H01L 2251/5361* (2013.01); *H05K 2201/10106* (2013.01)

(56) References Cited

U.S. PATENT DOCUMENTS

| | | | |
|---|---|---|---|
| 2003/0209977 | A1 | 11/2003 | Palanisamy |
| 2010/0295443 | A1* | 11/2010 | Roberts ............... H01L 51/5203 313/504 |
| 2011/0198657 | A1* | 8/2011 | Lang ................... H01L 51/5203 257/99 |
| 2013/0093308 | A1* | 4/2013 | Kagotani ............ H01L 51/5203 313/45 |
| 2013/0168649 | A1* | 7/2013 | Kim ...................... H01L 27/288 257/40 |
| 2014/0247600 | A1* | 9/2014 | Tanahashi ................. F21V 7/00 362/307 |
| 2015/0034931 | A1* | 2/2015 | Matsuda ............. H01L 27/3288 257/40 |
| 2016/0338162 | A1* | 11/2016 | Rickers ................. H05B 37/03 |

* cited by examiner

ORGANIC LIGHT-EMITTING COMPONENT HAVING ORGANIC LIGHT-EMITTING DIODE INTEGRALLY CONNECTED TO CIRCUIT BOARD

This patent application is a national phase filing under section 371 of PCT/EP2014/064966, filed Jul. 11, 2014, which claims the priority of German patent application 10 2013 107 467.7, filed Jul. 15, 2013, each of which is incorporated herein by reference in its entirety.

TECHNICAL FIELD

An organic light-emitting component is defined.

BACKGROUND

The International patent publication WO 2012/097008 describes a light-emitting component.

SUMMARY

Embodiments of the invention provide an organic light-emitting component which can be produced in an especially space-saving and economical way.

According to at least one embodiment of the organic light-emitting component, the component comprises an organic light-emitting diode. The organic light-emitting diode has at least one organic layer which is configured for generating light. The organic light-emitting diode can have a plurality of organic layers in which light of a different color can also be generated. For example, the organic light-emitting diode radiates colored or white light during operation. The organic light-emitting diode further comprises electrodes for contacting the organic layer and an encapsulation which protects the organic layer against mechanical and chemical stress.

According to at least one embodiment of the organic light-emitting component, the organic light-emitting component comprises a circuit board. The circuit board has at least one electrical conductor track. In particular, the circuit board has a multiplicity of electrical conductor tracks. The circuit board can also have electrical terminals to which components of the organic light-emitting component can be electrically conductively connected. The terminals are electrically conductively connected to at least some of the electrical conductor tracks. The circuit board can especially be a printed circuit board (PCB). The circuit board can also be a multilayer circuit board in which the electrical conductor tracks are arranged in a plurality of layers one above the other.

According to at least one embodiment of the organic light-emitting component, the circuit board is an integral constituent of the organic light-emitting diode. That is to say, the circuit board and the organic light-emitting diode are connected to one another, integrally, in such a way that they cannot be non-destructively detached from one another. In other words, separating the circuit board from the organic light-emitting diode would result in destruction of at least one of the two elements. In particular, the circuit board and the organic light-emitting diode share at least one component that is a constituent of both elements, that is to say of the circuit board and of the organic light-emitting diode. That at least one component then assumes a double function in the organic light-emitting component: it is a functional component of the circuit board and of the organic light-emitting diode.

According to at least one embodiment of the organic light-emitting component, at least one electrical conductor track of the circuit board is electrically conductively connected to the organic layer of the organic light-emitting diode. In that case the connection between the circuit board and the organic layer can be indirect. In particular, it is possible for at least one electrode of the organic light-emitting diode to be arranged between the organic layer and the conductor track. By way of the electrical conductor track, which is connected to the organic layer, it is possible, for example, to energize the organic layer.

According to at least one embodiment of the organic light-emitting component, the circuit board is electrically contactable from the side remote from the organic light-emitting diode. That is to say, the circuit board has, for example, at least one terminal on its upper side remote from the organic light-emitting diode, by means of which terminal the circuit board is electrically contactable. The circuit board is accordingly in particular contactable from outside the organic light-emitting diode.

According to at least one embodiment of the organic light-emitting component, the component comprises an organic light-emitting diode which has at least one organic layer that is configured for generating light. The component further comprises a circuit board having electrical conductor tracks. The circuit board is an integral constituent of the organic light-emitting diode. At least one of the electrical conductor tracks of the circuit board is electrically conductively connected to the organic layer of the organic light-emitting diode, and the circuit board is electrically contactable from the side remote from the organic light-emitting diode.

In the case of an organic light-emitting component described herein, an organic light-emitting diode is not mounted on a separate circuit board, but the circuit board with its electrical conductor tracks is an integral constituent of the organic light-emitting diode. In this way, the organic light-emitting component can be constructed in an especially space-saving and economical way. It is also possible for further electronic components, for example, for activating the organic light-emitting diode, to be mounted on the circuit board formed integrally with the organic light-emitting diode and in that way likewise produce an especially space-saving and economical arrangement. For integral connection of the organic light-emitting diode and the circuit board it is especially possible for the circuit board to be created on the organic light-emitting diode. That is to say, the circuit board at no time is present as a separate component, but is produced directly on the organic light-emitting diode.

According to at least one embodiment of the organic light-emitting component, at least one component of the organic light-emitting diode forms an electrically insulating base body of the circuit board. That is to say, the circuit board and the organic light-emitting diode have at least one component in common which assumes a function in both elements. In the case of the circuit board, that component fulfils the function of an electrically insulating base body. The electrically insulating base body can be, for example, the mechanically carrying and supporting component of the circuit board. On the side of the base body remote from the organic light-emitting diode it is then possible for, for example, a metal layer to be provided which serves for grounding the circuit board and for dissipating heat from the organic light-emitting diode.

According to at least one embodiment of the organic light-emitting component, the electrically insulating base body of the circuit board is formed at least partly by a thin-film encapsulation of the organic light-emitting diode. For example, the organic light-emitting diode has a substrate to the upper side of which the organic layer is applied. On its outer surface that is free of the substrate the organic layer can be completely covered by a thin-film encapsulation which protects the organic layer against moisture and atmospheric gases. The thin-film encapsulation can comprise, for example, one or more layers of an electrically insulating material such as silicon nitride, silicon dioxide, aluminum oxide. The layers of the thin-film encapsulation can be applied at least partly by means of an ALD (atomic layer deposition). The thin-film encapsulation is electrically insulating and can in that way form at least a part of the electrically insulating base body of the circuit board. For example, it is possible for the entire organic light-emitting diode to form the electrically insulating base body, that is to say the mechanically supporting and carrying element of the circuit board, in which case the thin-film encapsulation forms the electrically insulating outer surface of that base body.

According to at least one embodiment of the organic light-emitting component, the electrically insulating base body is formed by a covering body of the organic light-emitting diode. The covering body can be, for example, a plate made of a glass, a plastics material or a ceramic material which covers the organic light-emitting diode on its side remote from the substrate. For example, the covering body can also be applied to the thin-film encapsulation of the organic light-emitting diode on the side remote from the organic layer and provide scratch protection, that is to say mechanical protection, for the thin-film encapsulation. In the circuit board, the covering body then forms the electrically insulating base body of the circuit board, on which further layers of the circuit board are applied with structuring.

According to at least one embodiment of the organic light-emitting component, the circuit board comprises at least two layers which comprise an electrically insulating material and are arranged one above the other in a vertical direction perpendicular to the plane of main extent of the organic light-emitting diode. In such an arrangement at least one of the conductor tracks of the circuit board is arranged in, for example, each of the two layers.

In that case the circuit board is a multi-layer circuit board. Conductor tracks are arranged one above the other in the vertical direction and in some places spaced apart from one another in the lateral direction. The lateral direction is a direction running parallel to the plane of main extent of the organic light-emitting diode. The conductor tracks are adjacent to electrically insulating material in the lateral direction. Each layer of the circuit board is then formed in some places by the electrically insulating material and in some places by a conductor track of the circuit board.

According to at least one embodiment of the organic light-emitting component, the electrically insulating material and the conductor tracks of the layers have been applied to the organic light-emitting diode by means of printing processes. For example, a screen-printing process can be used to apply the electrically insulating material. In that case, regions are left free of electrically insulating material, which regions are in a subsequent printing process filled with the electrically conductive material of the conductor track. It is also possible for structuring of the electrically insulating material in each layer to be effected by means of a photographic technique.

According to at least one embodiment of the organic light-emitting component, the circuit board is electrically conductively connected to the organic layer by way of at least one via, which via in some regions extends into the organic light-emitting diode. The via passes, for example, through an encapsulation, for example, the thin-film encapsulation, of the organic light-emitting diode and contacts an electrode of the organic light-emitting diode which, in turn, is electrically conductively connected to the organic layer. The via can at least in some places also extend through the circuit board. The via is preferably also in direct contact with at least one conductor track of the circuit board. In that way it is possible for, for example, an activating apparatus to be connected to the organic layer by way of the circuit board, so that the generation of light in the organic layer can be controlled by the activating apparatus by way of the via.

According to at least one embodiment of the organic light-emitting component, an electronic component is arranged on the upper side of the circuit board remote from the organic light-emitting diode, the electronic component being electrically conductively connected to at least one of the conductor tracks of the circuit board. For example, the electronic component is mechanically attached to the upper side of the circuit board and is electrically conductively connected thereto. The electronic component can be, for example, an activating apparatus which comprises a microcontroller or a similar electronic device. Furthermore, further electronic components, such as ambient light sensors or temperature sensors, can be arranged on the circuit board.

In the case of an organic light-emitting component described herein it is therefore not necessary for electronic components that are to be electrically conductively connected to the organic light-emitting diode to be mounted on separate circuit boards, but rather the electronic components can be connected to the organic layer by way of the circuit board formed integrally with the organic light-emitting diode and in that way form with the circuit board and the organic light-emitting diode a compact organic light-emitting component.

Also defined is a method for producing an organic light-emitting component. By means of the method it is possible, in particular, to produce a component described herein, so that all features disclosed for the component are disclosed also for the method and vice versa. The method comprises in particular the following steps.

First of all the organic light-emitting diode is provided, the organic light-emitting diode being bounded in some places on its outer surface by the thin-film encapsulation.

In a next method step, a metallic layer is applied to the thin-film encapsulation. The metallic layer can be applied directly to the thin-film encapsulation, so that the metallic layer and the thin-film encapsulation are in direct contact with one another.

In that case it is possible, in particular, for the thin-film encapsulation to be applied in a vacuum chamber and for the metallic layer to be applied in the same vacuum chamber. This enables production to be especially efficient.

It is also possible, however, for a covering body to be applied to the thin-film encapsulation, for example, by lamination, and for the metallic layer to be applied to the upper side of the covering body located remote from the thin-film encapsulation. In that case, however, it is not possible to produce the metallic layer in the same vacuum chamber as the thin-film encapsulation.

In a next method step, the electrically insulating material of one of the at least one layers is applied to the upper side of the metallic layer remote from the thin-film encapsulation. The application is effected with structuring. That is to say, the underlying layer in some places remains uncovered by electrically insulating material. Accordingly, regions are formed that are free of electrically insulating material.

In a further method step, an electrically conductive material, for example, an electrically conductive paste, is applied to at least one region of the metallic layer that is free of electrically insulating material. In that way, one of the conductor tracks of the circuit board is created.

This method can be repeated as desired to form further layers, the structured application of the electrically insulating material then in each case being effected on the underlying layer of electrically insulating material and electrically conductive material.

BRIEF DESCRIPTION OF THE DRAWINGS

The organic optoelectronic component described herein and the method described herein are explained in detail below with reference to exemplified embodiments and the associated figures.

Figure 1A:
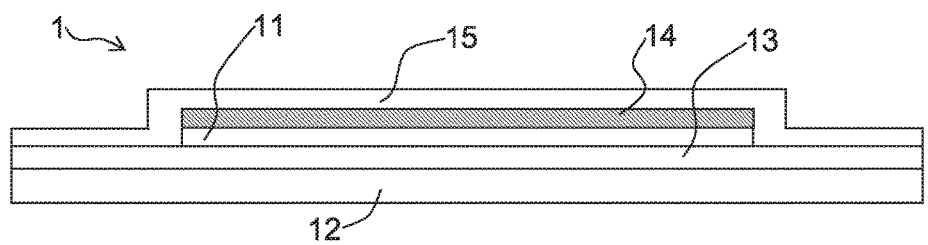
With reference to FIGS. 1A to 1F, an exemplified embodiment of a method described herein is described in detail with reference to diagrammatic sectional illustrations.

In the Figures, elements that are identical or similar or have identical action are denoted by the same reference numerals. The Figures and the relative sizes of the elements illustrated in the figures to one another should not be regarded as to scale; rather, the size of individual elements may have been exaggerated in the drawings for the purpose of better clarity and/or better understanding.

DETAILED DESCRIPTION OF ILLUSTRATIVE EMBODIMENTS

The diagrammatic sectional illustration in FIG. 1A shows an organic light-emitting diode, as provided for a method described herein. The organic light-emitting diode 1 comprises a substrate 12. The substrate 12 is a light-permeable substrate. The substrate 12 can be formed, for example, with glass, a plastics material or a ceramic material. The substrate 12 can be pellucidly transparent or milky, diffusely scattering.

On an upper side of the substrate 12 there is arranged a first electrode 13 which is a light-permeable electrode. The electrode 13 can be formed, for example, with a thin metal layer and/or with a transparent conductive oxide (TCO) such as ITO.

On the upper side of the first electrode 13 remote from the substrate 12 there is arranged at least one organic layer 11. The organic layer 11 comprises an organic material and it is configured for generating colored or white light when supplied with power.

On its upper side remote from the first electrode 13 there is arranged on the organic layer a second electrode 14 which is, for example, a reflecting electrode. The second electrode 14 is formed with a metal such as, for example, silver.

The stack formed by the electrodes 13, 14 and the organic layer is covered on its side remote from the substrate 12 by a thin-film encapsulation 15 which comprises, for example, a plurality of layers of an electrically insulating material.

Figure 1B:
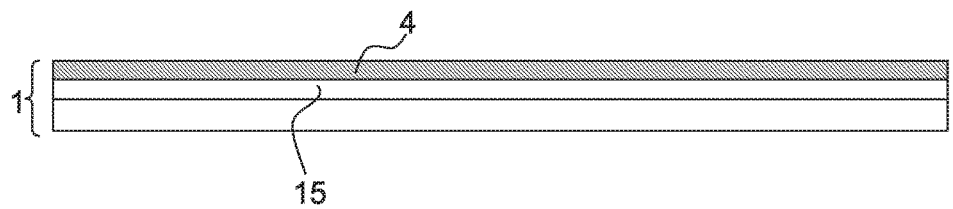

In the next method step, FIG. 1B, a metallic layer 4 is applied on the side of the thin-film encapsulation 15 remote from the organic light-emitting diode 1. The metallic layer 4 can be applied, for example, in the same vacuum chamber as the thin-film encapsulation 15. The organic light-emitting diode 1 with the thin-film encapsulation 15 on its upper side then forms an electrically insulating base body for the subsequently formed circuit board 2.

Figure 1C:
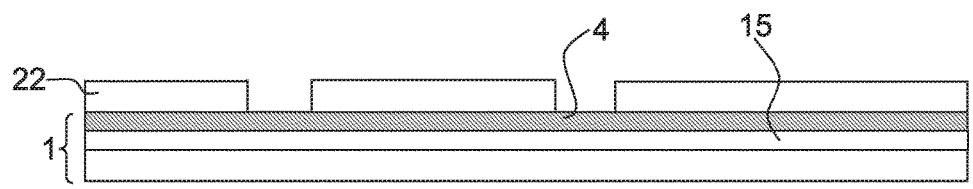

In the next method step, FIG. 1C, the electrically insulating material of a first layer 22 of the circuit board is applied, with structuring, to the metallic layer 4. Parts of the metallic layer 4 remain uncovered by electrically insulating material. The application of the electrically insulating material of the first layer 22 can be effected, for example, by means of a screen-printing process.

Figure 1D:
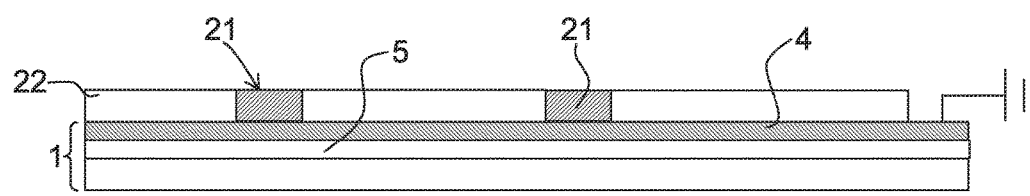

In the next method step, FIG. 1D, an electrically conductive material is introduced into the regions that have been left free to form conductor tracks 21.

Figure 1E:
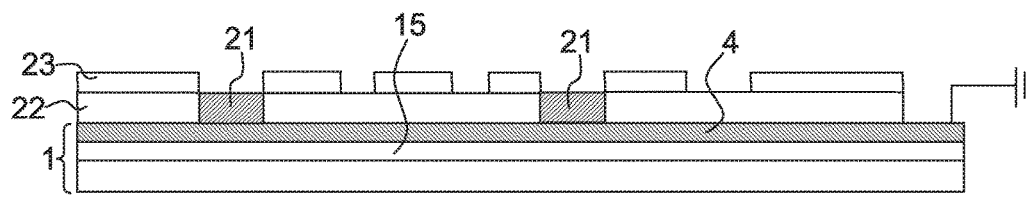
Figure 1F:
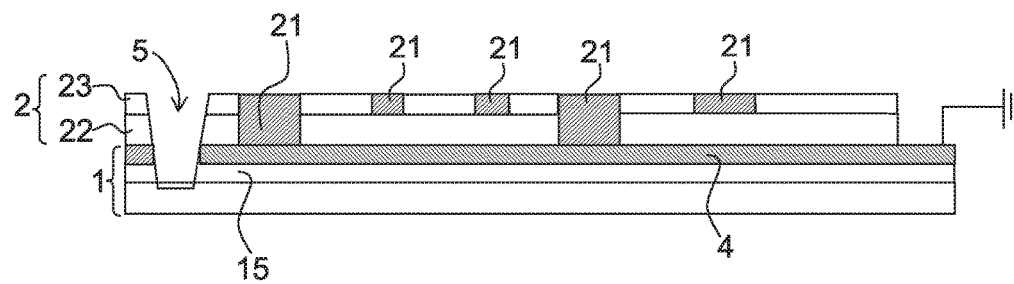

In the subsequent method step, FIG. 1E, a second layer 23, which likewise comprises electrically insulating material, is applied to the first layer 22. Regions that are left free are filled with electrically conductive material to form further conductor tracks 21, see FIG. 1F.

Finally, a via 5 can be created which extends into the organic light-emitting diode 1, where it contacts one of the electrodes 13, 14. The component can comprise a further via (not shown) for contacting the other electrode. The metallic layer 4 can likewise be exposed for contacting purposes, for example for grounding.

The overall result is an optoelectronic component in which the organic light-emitting diode 1 and the circuit board 2 are integrated with one another, so that the circuit board 2 is an integral constituent of the organic light-emitting diode 1. The circuit board 2 cannot be non-destructively detached from the organic light-emitting diode 1. The circuit board 2 is a multi-layer layer circuit board in which different conductor tracks 21 can be connected to one another across layers.

In conjunction with FIGS. 2A to 2F, a further exemplified embodiment of the method described herein is explained, in which the circuit board 2 is applied to the covering body 16 of the organic light-emitting diode. The application of the circuit board 2 to the covering body can be effected after completion of the organic light-emitting diode 1, that is to say once the covering body 16, for example, has been laminated onto the thin-film encapsulation 15. It is also possible for the circuit board to be provided with the layers of the circuit board before application of the covering body 16 to the organic light-emitting diode 1. In a first method step, FIG. 2A, the covering body 16, which consists, for example, of a glass, is provided.

Figure 2A:
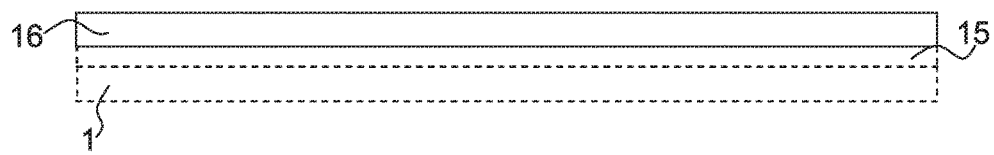
With reference to FIGS. 2A to 2F, a further exemplified embodiment of a method described herein is explained in detail with reference to diagrammatic illustrations.
Figure 2B:
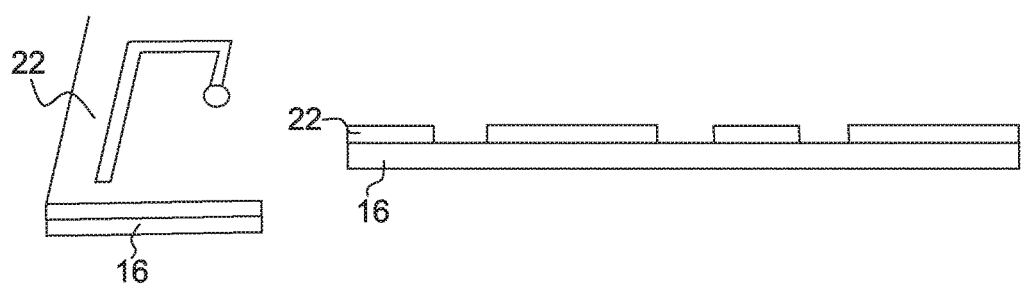
Figure 2C:
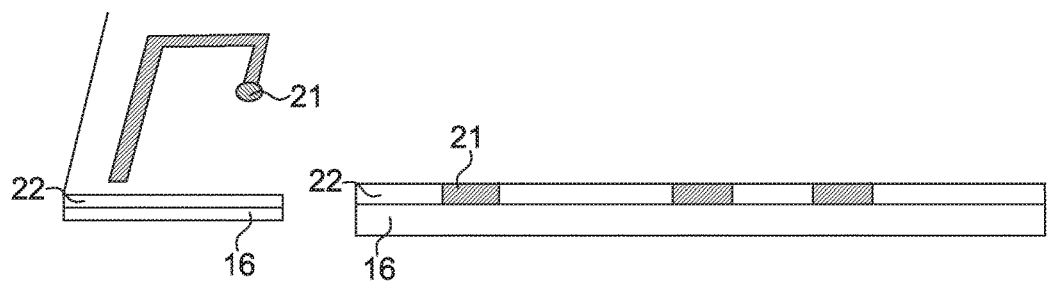

In the next method step, FIG. 2B, first of all the first layer 22 is created on the upper side of the covering body 16 by structured application of the electrically insulating material. Regions are left free for forming the conductor tracks 21. The electrically insulating material is applied, for example, by means of a screen-printing process.

In the next method step, the non-covered regions are filled with a conductive metal paste, for example, by screen-printing, doctor blading, stencil-printing.

In that way, a first layer 22 of the circuit board is created which is structured in electrically insulating material and electrically conductive material.

Figure 2D:
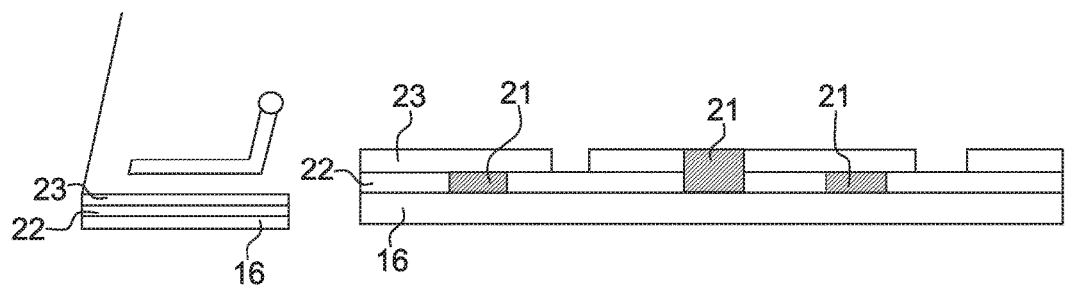
Figure 2E:
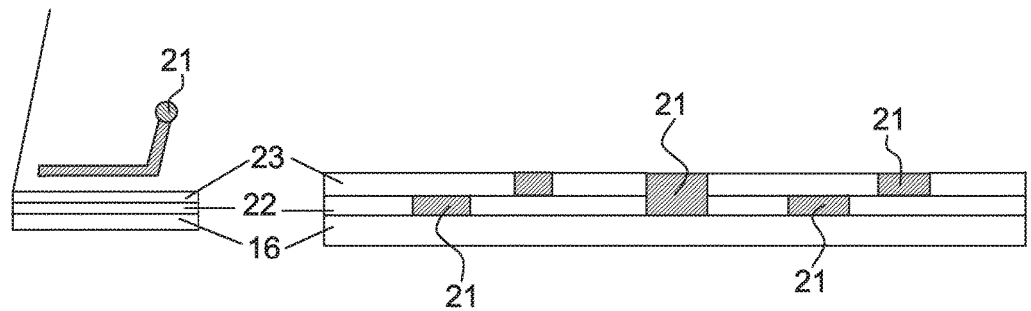

In further method steps, FIGS. 2D and 2E, a further layer 23 of the conductor track is created in the same way, which further layer likewise comprises electrically insulating material and electrically conductive material. Electrical conductor tracks 21 from different layers 22, 23 can be connected to one another.

Figure 2F:
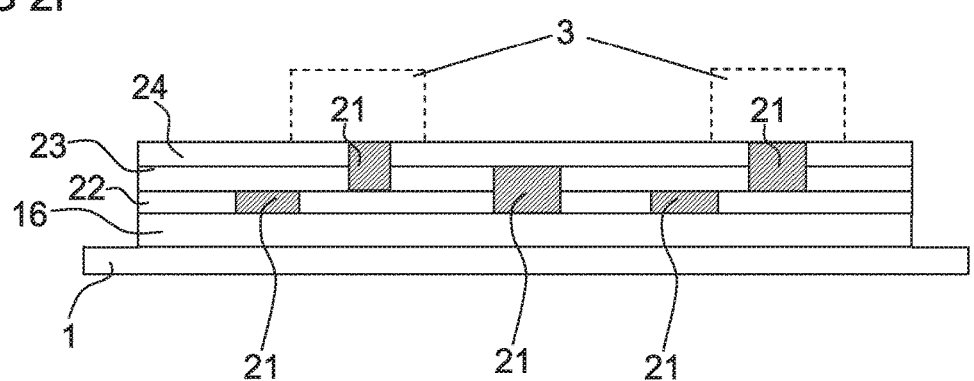

As FIG. 2F shows, this results, for example, in a three-layer circuit board having the layers 22, 23, 24, which circuit board comprises the covering body 16 of the organic light-emitting diode 1 as electrical base body. On the upper side of the circuit board 2 remote from the organic light-emitting diode 1 there are arranged further electrical components 3 which are in mechanical and electrical connection with the circuit board 2 and, by way of the circuit board 2, are connected to the organic light-emitting diode 1 and there, in particular, to the organic layer 11. The electrical components can be, for example, an activating apparatus, a temperature sensor, an ambient light sensor or similar components.

The description of the invention with reference to the exemplified embodiments does not limit the invention thereto; rather the invention encompasses any novel feature and any combination of features, including in particular any combination of features in the patent claims, even if that feature or that combination is not itself explicitly defined in the patent claims or exemplified embodiments.

The invention claimed is:

1. An organic light-emitting component comprising:
   an organic light-emitting diode comprising an organic layer configured to generate light and having a covering body disposed over an electrode and the organic layer with the electrode disposed between the covering body and the organic layer; and
   a circuit board having electrical conductor tracks and a metallic layer disposed on a first side of the circuit board, wherein at least one of the conductor tracks is electrically conductively connected to the metallic layer;
   wherein an electrical conductor track of the circuit board is electrically conductively connected to the organic layer of the organic light-emitting diode through the metallic layer;
   wherein the circuit board is electrically contactable from a second side remote from the organic light-emitting diode and opposite the first side;
   wherein the circuit board is arranged on the organic light-emitting diode with the metallic layer disposed on, and in contact with, the covering body;
   wherein a component of the organic light-emitting diode forms an electrically insulating base body of the circuit board; and
   wherein the electrically insulating base body is formed at least partly by the covering body of the organic light-emitting diode.

2. The organic light-emitting component according to claim 1, wherein the circuit board comprises a first layer and a second layer that each comprise an electrically insulating material and are arranged one above the other in a vertical direction perpendicular to a plane of main extent of the organic light-emitting diode, a conductor track of the electrical conductor tracks being arranged in each of the first and second layers.

3. The organic light-emitting component according to claim 2, wherein the electrically insulating material of the first and second layers and the conductor tracks have been applied to the organic light-emitting diode by printing processes.

4. The organic light-emitting component according to claim 1, wherein the circuit board is electrically conductively connected to the organic layer by way of a via that extends into the organic light-emitting diode.

5. The organic light-emitting component according to claim 1, further comprising an electronic component arranged on an upper side of the circuit board remote from the organic light-emitting diode, wherein the electronic component is electrically conductively connected to a conductor track of the electrical conductor tracks of the circuit board.

6. The organic light-emitting component according to claim 1, wherein the electrically insulating base body is formed at least partly by a thin-film encapsulation of the organic light-emitting diode.

7. The organic light-emitting component according to claim 1, wherein the electrically insulating base body is at least partly formed by a thin-film encapsulation of the organic light-emitting diode;
   wherein the circuit board is electrically conductively connected to the organic layer by a via that extends into the organic light-emitting diode; and
   wherein the via passes through the thin-film encapsulation of the organic light-emitting diode.

8. A method of producing an organic light-emitting component, the method comprising:
   providing an organic light-emitting diode having an organic layer configured to generate light and further having an outer layer over the organic layer and an electrode that is disposed between the outer layer and the organic layer, wherein the outer layer is one of a thin-film encapsulation or a covering body; and
   forming a circuit board having electrical conductor tracks, wherein the circuit board is created on the organic light-emitting diode and is integrally connected to the organic light-emitting diode with a first side of the circuit board attached to the organic light emitting diode;
   forming a via through the circuit board and extending from a second side of the circuit board remote from the first side, through the circuit board and through the outer layer to the electrode such that the via contacts the electrode;
   wherein an electrical conductor track of the circuit board is electrically conductively connected to the organic layer of the organic light-emitting diode;
   wherein the circuit board is electrically contactable from a side remote from the organic light-emitting diode; and
   wherein the circuit board at no time of the method being present as a separate component, but being produced directly on the organic light-emitting diode.

9. The method according to claim 8, wherein, owing to the integral connection, the circuit board and the organic light-emitting diode cannot be non-destructively detached from one another.

10. The method according to claim 8, wherein a component of the organic light-emitting diode forms an electrically insulating base body of the circuit board, the electrically insulating base body being formed at least partly by a thin-film encapsulation of the organic light-emitting diode.

11. The method according to claim 8, wherein a component of the organic light-emitting diode forms an electrically insulating base body of the circuit board, the electrically insulating base body being formed at least partly by a covering body of the organic light-emitting diode.

* * * * *